United States Patent [19]

Reed

[11] Patent Number: 5,087,808
[45] Date of Patent: Feb. 11, 1992

[54] COMBINED OPTICAL POWER AND NOISE METER

[76] Inventor: Edwin A. Reed, 1092 W. 17th St., Upland, Calif. 91786

[21] Appl. No.: 661,427

[22] Filed: Feb. 26, 1991

[51] Int. Cl.$^5$ ............................................. G01J 1/44
[52] U.S. Cl. ........................ 250/214 R; 250/214 A; 356/218; 356/226; 356/227
[58] Field of Search ....... 250/214 R, 214 A, 214 AG, 250/214 B; 356/218, 223, 226, 227; 374/32

[56] References Cited

U.S. PATENT DOCUMENTS

| | | | |
|---|---|---|---|
| 3,687,558 | 8/1972 | Rex | 356/218 |
| 3,966,325 | 6/1976 | Mohler | 356/218 |
| 4,366,378 | 12/1982 | Simons | 250/214 B |
| 4,749,275 | 6/1988 | Shimomura et al. | 250/214 R |
| 4,864,218 | 9/1989 | Leake et al. | 324/613 |
| 4,889,985 | 12/1989 | Allsop et al. | 250/214 A |

*Primary Examiner*—Carolyn E. Fields
*Attorney, Agent, or Firm*—W. Edward Johansen

[57] ABSTRACT

A combined optical power and noise meter for measuring both optical power and optical noise includes a detector housing and a photodiode which is disposed in the detector housing. The resistance of the photodiode changes continually in response to the application of optical power thereon. A current to voltage converter applies a bias voltage to the photodiode and transforms an output current therefrom in order to obtain a power voltage which is proportional to the optical power. A first voltage meter is electrically coupled to the current to voltage converter in order to display the power voltage. A noise measuring circuit measures noise in the output voltage of the current to voltage converter and processes the output voltage in order to obtain a noise voltage which is proportional to the optical noise. A divider divides the noise voltage by the power voltage in order to obtain an optical noise to optical power voltage which is proportional to the ratio of optical noise to optical power. A second voltage meter is electrically coupled to the divider in order to display the optical noise to optical power voltage.

1 Claim, 2 Drawing Sheets

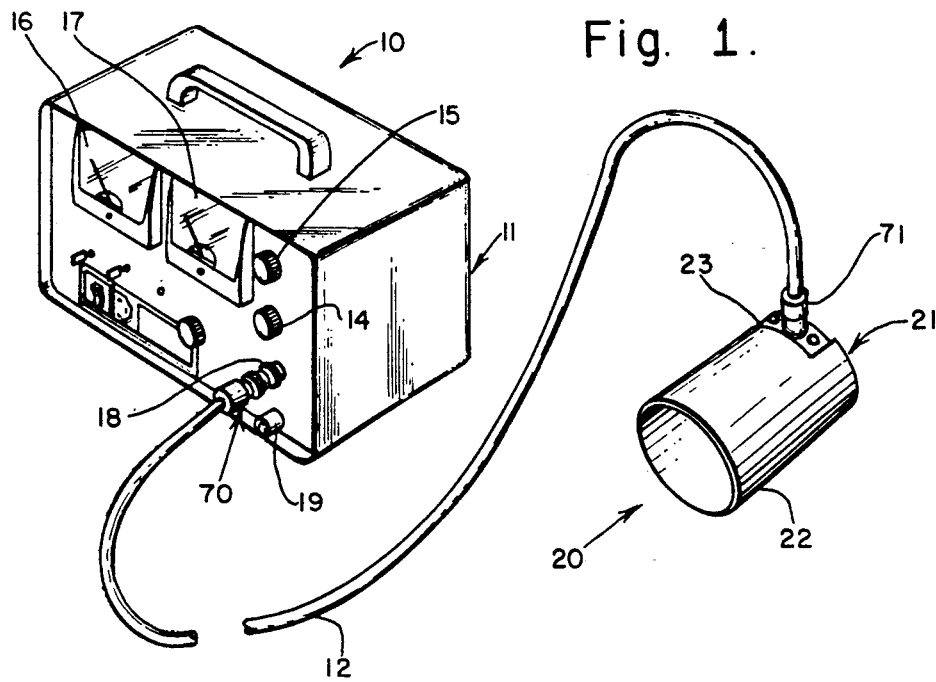
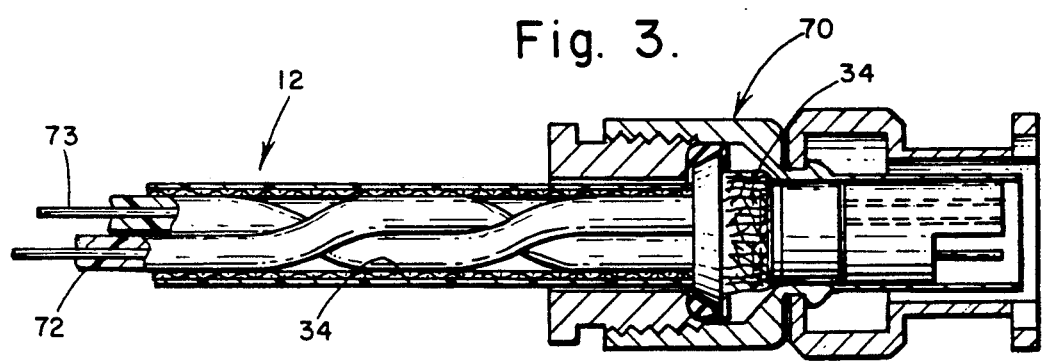
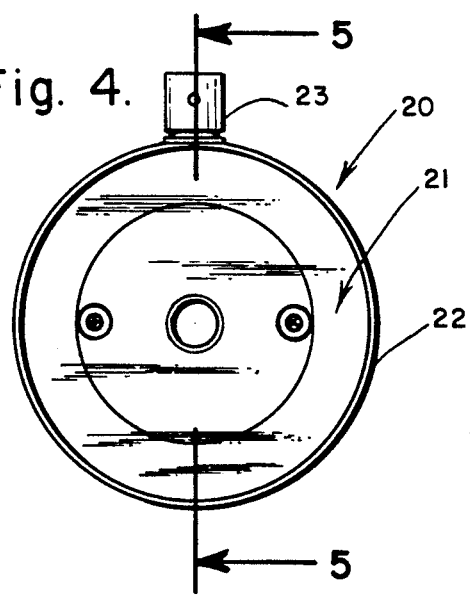
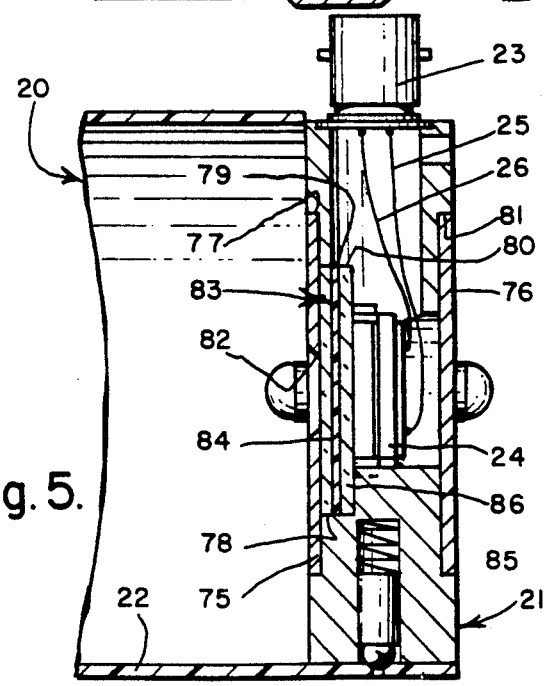

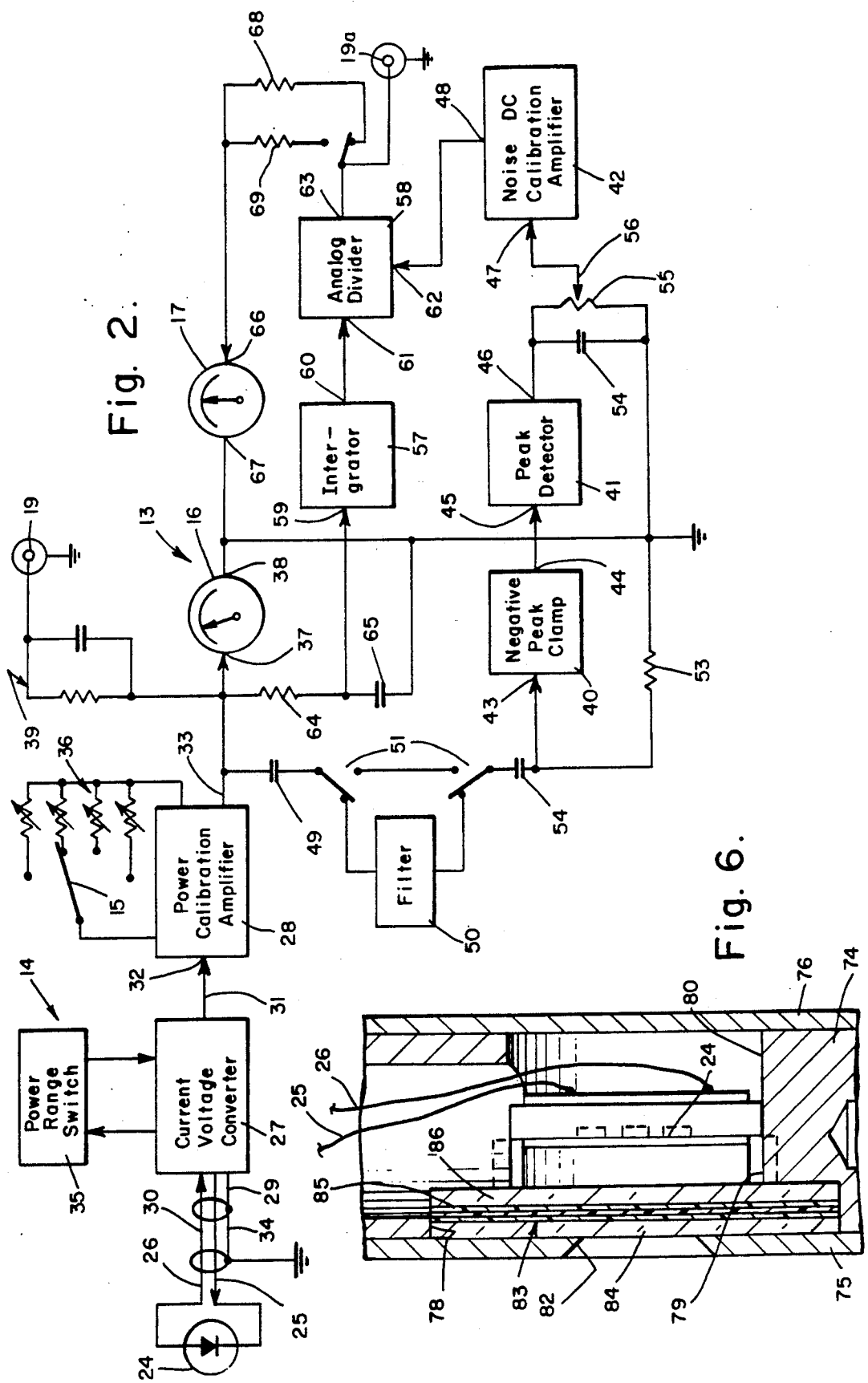

COMBINED OPTICAL POWER AND NOISE METER

BACKGROUND OF THE INVENTION

1. Field of the Invention

The present invention relates to the field of optical power meters which measure optical power and more particularly to a combined optical power and noise meter which also measures optical noise.

2. Description of the Prior Art

U.S. Pat. No. 4,889,985, entitled Combined Optical Power Meter and Receiver, issued to Bryan E. Allsop, Allen W. Mabbitt and Kevin K. Smith on Dec. 26, 1989, teaches a combined optical power meter and receiver in which the optical power meter retains high sensitivity and the optical receiver retains high bandwidth. A single photodiode provides current for both the optical power meter and the optical receiver. A first operational amplifier is configured as an integrating transimpedance amplifier having a current input which is referenced to a reference voltage and receives current from one port of the photodiode. A second operational amplifier is configured as a transimpedance amplifier having a current input which is referenced to ground and receives current from the other port of the photodiode. In this manner, a bias voltage is developed across the photodiode to decrease the capacitance and increase the operational speed of the receiver. A second material photodiode is provided which is shielded from the input light source is coupled to the current input of the first transimpedance amplifier. The polarity of the second photodiode is such that a path exists for the leakage current of the first photodiode, which decreases the sensitivity of the optical power meter to thermal variations in leakage current.

U.S. Pat. No. 4,904,035, entitled Coupling Device for Guiding a Light Beam, issued to Siegfried Heckmann and Johannes Rybach on Feb. 27, 1990, teaches a coupling device for guiding a light beam sent through an end portion of an optical waveguide to the light-sensitive surface of a photodiode of a measuring instrument, in particular, an optical power meter, comprising an absorbing aperture associated with the end face of the optical waveguide, and having an aperture which widens conically towards the light-sensitive face of a photodiode, the aperture plate facing the end face of the optical waveguide with its side where the diameter of said aperture is smallest but slightly larger than the diameter of said end face of the optical waveguide. A device of simple construction and having substantially no reflection is obtained in that the light beam is directed straight to the light-sensitive surface of the photodiode.

U.S. Pat. No. 4,908,567, entitled Power supply System for an Optical Inspection Apparatus, issued to Robert H. Welker and Ken Smith on Mar. 13, 1990, teaches an optical inspection apparatus consists of an explosion-proof light projector and a viewing periscope. In one embodiment, an external power source connects to an explosion-proof housing protectively enclosing a lamp. In another embodiment, the lamp, batteries, and a circuit are included within the explosion-proof housing, providing a fully portable, self-contained and explosion-proof light projector. A viewing periscope is provided for examination of meter tubes, tanks vessels and other enclosed machinery. An explosion-proof connector is also disclosed providing an explosion-proof and thermally resistant interface between a light source and a fiberoptic light guide. A timing circuit disclosed prolonging the operation time of the light projector on one charge of the battery.

U.S. Pat. No. 4,927,266, entitled Optical Signal Generating Apparatus and Optical Power Meter Calibrating System Using the Same, issued to Itsuo Sugiura, Yutaka Nishida, Kaoru Ito and Toshiyuki Ozaki on May 22, 1990, teaches in an optical signal generating apparatus output light from a light source driven by a light source driver is externally output from an optical receptacle through a variable optical attenuator. An output monitor unit can be detachably connected to the optical receptacle through an optical connector. When an absolute level of the output light is to be set, a CPU compares a set value from an output level setting unit with an output value from the output monitor unit and controls the variable optical attenuator and the light source driver so that a comparison error becomes zero. The CPU maintains the above control of the variable optical adjuster and the light source driver so that the light is output to be the desired level set by the output level setting unit even after the output monitor unit is disconnected from the optical receptacle including the timing at which the comparison error becomes zero. An optical power meter calibrating system includes the above optical signal generating apparatus as a stabilized light source. In the optical power meter calibrating system, in place of the output monitor unit, a standard optical power meter and an optical power meter to be calibrated are selectively, detachably connected to perform calibration.

U.S. Pat. No. 4,749,275, entitled Optical Power Meter with Automatic Switching of Photodetectors having Different Wavelength Sensitivity Characteristics, issued to Teiichi Shimomura and Kunio Ishikawa on June 7, 1988, teaches an optical power meter system which includes a chopper with a semicircular total reflection mirror along an incident light path, two photo-detectors of different characteristics of wavelength sensitivity, and a comparator for comparing the levels of the photo-detection signals derived from the two photo-detectors and for outputting the optical detection signal of a higher level. The photo-detectors are positioned in a first path of the light passing through the chopper and a second path of the light reflected by the chopper, respectively. The comparator may be replaced by an adder for adding the photo-detection signals derived from the two photo-detectors.

U.S. Pat. No. 4,865,446, entitled Laser Power and Energy Meter, issued to Takemi Inoue and Ichiro Yokoshima on Sept. 12, 1989, teaches a laser power and energy meter has a target surface provided with at least one pin hole for passing a small portion of the laser beam impinging thereon and further has a light detector positioned in the path of the laser light passing through the pin hole. The target surface is moved horizontally and vertically to cause the laser beam to scan the target surface and the center of the laser beam is aligned with the center of the target surface.

U.S. Pat. No. 4,864,218, entitled Method of Compensating for Frequency Errors in Noise Power Meters, issued to Bernard W. Leake and Andrew C. Davidson on Sept. 5, 1989, teaches a method of measuring and compensating for measurement frequency inaccuracies encountered when measuring noise power of a device under test within a desired calibrating frequency range.

The method includes sweeping a frequency synthesizer through a frequency range which includes the desired measurement frequency range. Power is measured for different synthesizer frequencies with the noise power meter set to the desired frequency range. Alternatively, the frequency synthesizer may be set to the desired measurement frequency and the noise power meter swept through a range including the desired measurement frequency. The resulting power measurements show the frequency range within which the noise power meter actually measured power. The difference between the desired measurement frequency range and the actual measurement frequency rang is the measurement frequency error which may be corrected using a frequency conversion stage to displace test signals by the amount of the measurement frequency error before they are sent to the noise power meter.

SUMMARY OF THE INVENTION

In view of the foregoing factors and conditions which are characteristic of the prior art it is the primary object of the present invention to provide a combined optical power and noise meter which not only measures optical power, but which also measures optical noise.

It is another object of the present invention to provide combined optical power and noise meter which can measure optical noise in a noisy electromagnetic environment.

In accordance with an embodiment of the present invention a combined optical power and noise meter for measuring optical power and optical noise is described. The combined optical power and noise meter includes a detector housing and a photodiode which is disposed in the detector housing. The resistance of the photodiode changes continually in response to the application of optical power thereon. A current to voltage converter applies a bias voltage to the photodiode and transforms an output current therefrom in order to obtain a power voltage which is proportional to the optical power. A first voltage meter is electrically coupled to the current to voltage converter in order to display the power voltage. A noise measuring circuit measures noise in the output voltage of the current to voltage converter and processes the output voltage in order to obtain a noise voltage which is proportional to the optical noise. A divider divides the noise voltage by the power voltage in order to obtain an optical noise to optical power voltage which is proportional to the ratio of optical noise to optical power. A second voltage meter is electrically coupled to the divider in order to display the optical noise to optical power voltage.

The features of the present invention which are believed to be novel are set forth with particularity in the appended claims.

Other claims and many of the attendant advantages will be more readily appreciated as the same becomes better understood by reference to the following detailed description and considered in connection with the accompanying drawing in which like reference symbols designate like parts throughout the figures.

DESCRIPTION OF THE DRAWING

FIG. 1 is a perspective view of a combined optical power and noise meter which includes a detector and a processing circuitry and which has been constructed in accordance with the principles of the present invention.

FIG. 2 is a schematic drawing of the processing circuitry of the combined optical power and noise meter of FIG. 1.

FIG. 3 is an elevational view in cross-section of a male and female BNC connector plug of the combined optical power and noise meter of FIG. 1.

FIG. 4 is a front view of the detector of the combined optical power and noise meter of FIG. 1.

FIG. 5 is an elevational view in cross-section of the detector of the combined optical power and noise meter of FIG. 1 taken along the line 5—5 of FIG. 4.

FIG. 6 is an enlarged, partial elevational view in cross-section of the detector of the combined optical power and noise meter of FIG. 1 taken along the line 5—5 of FIG. 4 showing in detail the elements of the detector.

DESCRIPTION OF THE PREFERRED EMBODIMENT

In order to best understand the present invention it is necessary to refer to the following description of its preferred embodiment in conjunction with the accompanying drawing. Referring to FIG. 1 a combined optical power and noise meter 10 includes a case 11 and a shielded, double wire coaxial cable 12 which has a male and female BNC connector plug at each of its ends. The case 11 includes a processing circuitry 13. The case 11 also includes a power range switch 14, a wavelength selector switch 15, a power meter 16, a noise meter 17, a first male and female BNC connector receptacle 18, a first female connector receptacle 19 for a shielded, single wire coaxial cable for use in connecting to a oscilloscope and/or a chart recorder for showing power readings and a second female connector receptacle (not shown) for a shielded, single wire coaxial wire for use in connecting to a chart recorder for showing noise to power ratio readings. The power range switch 14, the wavelength selector switch 15, the power meter 16, the noise meter 17, the first male and female BNC connector receptacle 18 and the female connector receptacle 19, are all electrically coupled to the processing circuitry 13. The combined optical power and noise meter 10 also includes a detector 20. The detector 20 includes a detector head 21, a detector light shield 22 and a second male and female BNC connector receptacle 23 for electrically coupling the detector 20 to the processing circuitry 13 through the shielded, double wire coaxial cable 12.

Referring to FIG. 2 in conjunction with FIG. 1 the detector 20 includes a photodiode 24 having an input lead 25 and an output lead 26. The processing circuitry 13 includes a current to voltage converter 27 and a power calibration amplifier 28. The current to voltage converter 27 has a voltage bias output lead 29, a current input lead 30 and an output lead 31. The power calibration amplifier 28 has an input lead 32 and an output lead 33. The voltage bias output lead 29 and the current input lead 30 of the current to voltage converter 27 are electrically coupled to the input lead 25 and the output lead 26, respectively, of the photodiode 24 by the shielded, double wire coaxial cable 12. The shielding material 34 of the shielded, double wire coaxial cable 12 is at ground. The current to voltage converter 27 includes a first operational amplifier and a group of resistors 35 from which a user may select a resistor for use in series with the first operational amplifier by using the power range switch 14. The input lead 32 of the power calibration amplifier 28 is electrically coupled to the output lead 31 of the current to voltage converter 27 which includes a second operational amplifier and a group of variable resistors 36. The photodiode 24 has a photo-sensitive surface and a spectral response in the range of 320 to 1060 nanometers and is in a ceramic package. The S1723-05 PIN silicon photodiode is the photodiode 24 which is being used. The spectral response of the photodiode 24 to optical power is different for different wavelengths. Each variable resistor 36 has been designated for optical power of a specific wavelength from which a user may select for use in series with the second operational amplifier by using the wavelength selector switch 15. The user calibrates the processing circuitry 13 by varying the designated variable resistor 36. The power meter 16 has an input lead 37 and a grounding lead 38 which is electrically coupled to ground. The output lead 33 of the power calibration amplifier 28 is electrically coupled to the input lead 37 of the power meter 16 and the female BNC connector receptacle 19 through a resistor and capacitor network 39.

Referring still to FIG. 2 the processing circuitry 13 also includes a negative peak clamp 40, a peak detector 41 and a noise D. C. calibration amplifier 42. The negative peak clamp 40 has an input lead 43 and an output lead 44. The peak detector 41 has an input lead 45 and an output lead 46. The noise D. C. calibration amplifier 42 has an input lead 47 and an output lead 48. The input lead 43 of the negative peak clamp 40 is electrically coupled to the output lead 33 of the power calibration amplifier 28 through a first capacitor 49, which eliminates the D.C. component of the voltage signal, a low-pass filter 50, which may be bypassed by a pair of switches 51, and a second capacitor 52 in series. A resistor 53 electrically couples the input lead 43 of the negative peak clamp 40 to ground. The output lead 44 of the negative peak clamp 40 is electrically coupled to the input lead 45 of the peak detector 41. The output lead 46 of the peak detector 41 is electrically coupled to a first lead of a capacitor 54 a second lead of which is electrically coupled to ground. Across the capacitor 54 is a potentiometer 55 which has a wiper output lead 56. The input lead 47 of the noise D. C. calibration amplifier 42 is electrically coupled to the wiper output lead 56 of the potentiometer 55. The processing circuitry 13 further includes an integrator 57 and an analog divider 58. The integrator 57 has an input lead 59 and an output lead 60. The analog divider 58 has a first input lead 61, a second input lead 62 and an output lead 63. The output lead 33 of the power calibration amplifier 28 is electrically coupled to the input lead 59 of the integrator 57 through a resistor 64. The input lead 59 of the integrator 57 is electrically coupled to a first lead of a capacitor 65 a second lead of which is electrically coupled to ground. The output lead 60 of the integrator 57 is electrically coupled to the first input lead 61 of the analog divider 58. The output lead 48 of the noise D. C. calibration amplifier 42 is electrically coupled to the second input lead 62 of the divider 58. The noise meter 17 has an input lead 66 and a grounding lead 67 which is electrically coupled to ground. The output lead 63 of the divider 58 is electrically coupled to the input lead 66 of the noise meter 17 through either a first resistor 68 or second resistor 69.

Referring to FIG. 1 in conjunction with FIG. 3 the shielded, double wire coaxial cable 12 has a first male and female BNC connector plug 70 at a first end and a second male and female BNC connector plug 71 at a first end. The shielded, double wire coaxial cable 12 has a first wire 72 and a second wire 73. The first and second wires 72 and 73 are lightly twisted in order to either eliminate or at least minimize external electromagnetic noise.

Referring to FIG. 1 in conjunction with FIG. 4 the detector includes the detector head 21, the detector light shield 22 and the second male and female BNC connector receptacle 23. The second male and female BNC connector receptacle 23 of the detector 20 is electrically coupled to the processing circuitry 13 by the shielded, double wire coaxial cable 12.

Referring to FIG. 5 in conjunction with FIG. 4 and FIG. 6 the detector head 21 includes a housing 74, a front plate 75 which is circular and which is of a first diameter and a rear plate 76 which is circular and which is also of the first diameter. The housing 74 has a first bore 77, a second bore 78, a third bore 79, a fourth bore 80 and a fifth bore 81 all of which are axially aligned. The first and fifth bores 77 and 81 are circular and are of the first diameter in order to flushly and slidably receive the front plate 75 and the rear plate 76, respectively. The second bore 78 is circular and is of a second diameter which is smaller than the first diameter. The third bore 79 is square-shaped and has smaller dimension than the second bore 78. The fourth bore 80 is circular and is of a third diameter which is smaller than the second diameter. The front plate 75 has a bore 82 which is circular and which is of a fourth diameter which is smaller than the third diameter. The bore 82 of the front plate 75 is axially aligned with the first bore 77 of the housing 74. The photodiode 24 is disposed in the third bore 79 of the housing 74 and secured therein with an adhesive material. The input lead 25 and the output lead 26 of the photodiode 24 are electrically coupled to the female and male ends, respectively, of the second male and female BNC connector receptacle 23. The output lead 29 and the current input lead 30, respectively, of the current to voltage converter 27 are electrically coupled to the female and male pins, respectively, of the first male and female BNC connector receptacle 18. Each end of the first wire 72 is electrically coupled to one of the male pins of the first and second male and female BNC connector plugs 70 and 71, respectively. Each end of the second wire 73 is electrically coupled to one of the female pins of the first and second male and female BNC connector plugs 70 and 71, respectively. The first and second male and female BNC connector receptacles 18 and 23 are mechanically and electrically coupled to the first and second male and female BNC connector plugs 70 and 71, respectively. The input lead 25 and the output lead 26 of the photodiode 24 are electrically coupled to the output lead 29 and the current input lead 30, respectively, of the current to voltage converter 27 through the first and second male and female BNC connector receptacles 18 and 23, the first and second male and female BNC connector plugs 70 and 71 and the first and second wires 72 and 73. A filter packet 83 is placed in the second bore 78 and includes a circularly shaped piece of quartz disc 84 the front surface of which is frosted, three circularly shaped pieces 85 of Teflon sheet-material and an neutral density filter 86 which is formed out of quartz.

From the foregoing it can be seen that a combined optical power and noise meter has been described. It should be noted that distances of and between the figures are not to be considered significant.

Accordingly it is intended that the foregoing disclosure and showing made in the drawing shall be considered only as an illustration of the principles of the present invention.

What is claimed is:

1. A combined optical power and noise meter for measuring both optical power and optical noise, said combined optical power and noise meter comprising:
   a. a detector housing;
   b. a photodiode which is disposed in said detector housing and the resistence of which changes continually in response to the application of optical power thereon;
   c. current to voltage converting means for applying a bias voltage to said photodiode and for transforming an output current therefrom in order to obtain a power voltage which is proportional to the optical power;
   d. a first voltage meter which is electrically coupled to said current to voltage converting means in order to display said power voltage;
   e. noise measuring means for measuring noise in the output voltage of said current to voltage converting means and for processing said output voltage in order to obtain a noise voltage which is proportional to the optical noise;
   f. dividing means for dividing said noise voltage by said power voltage in order to obtain an optical noise to optical power voltage which is proportional to the ratio of optical noise to optical power; and
   g. a second voltage meter which is electrically coupled to said dividing means in order to display said optical noise to optical power voltage.

* * * * *